United States Patent
Foad

(10) Patent No.: US 10,691,013 B2
(45) Date of Patent: Jun. 23, 2020

(54) EXTREME ULTRAVIOLET LITHOGRAPHY SYSTEM HAVING CHUCK ASSEMBLY AND METHOD OF MANUFACTURING THEREOF

(71) Applicant: Applied Materials, Inc., Santa Clara, CA (US)

(72) Inventor: Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 72 days.

(21) Appl. No.: 15/031,677

(22) PCT Filed: Dec. 19, 2014

(86) PCT No.: PCT/US2014/071698
§ 371 (c)(1),
(2) Date: Apr. 22, 2016

(87) PCT Pub. No.: WO2015/095808
PCT Pub. Date: Jun. 25, 2015

(65) Prior Publication Data
US 2016/0342096 A1  Nov. 24, 2016

Related U.S. Application Data

(60) Provisional application No. 61/919,781, filed on Dec. 22, 2013.

(51) Int. Cl.
  *G03F 7/20* (2006.01)
  *G03F 1/22* (2012.01)
  *H01L 21/683* (2006.01)
  *G03F 1/60* (2012.01)

(52) U.S. Cl.
  CPC ............ *G03F 1/22* (2013.01); *G03F 1/60* (2013.01); *G03F 7/70708* (2013.01); *G03F 7/70783* (2013.01); *G03F 7/70875* (2013.01); *H01L 21/6831* (2013.01); *G03F 7/2004* (2013.01)

(58) Field of Classification Search
  CPC .................................................. G03F 7/2004
  See application file for complete search history.

(56) References Cited

U.S. PATENT DOCUMENTS

| | | | |
|---|---|---|---|
| 7,081,956 B1 | 7/2006 | Lalovic et al. | |
| 7,652,867 B2 | 1/2010 | Retzlaff | |
| 7,817,252 B2 | 10/2010 | Vernon | |
| 8,399,159 B2* | 3/2013 | Sasaki | B24B 1/005 430/311 |
| 9,612,521 B2* | 4/2017 | Hofmann | C23C 14/352 |
| 2004/0106068 A1 | 6/2004 | Dierichs | |
| 2005/0092013 A1 | 5/2005 | Emoto | |
| 2006/0029866 A1 | 2/2006 | Schwarzl et al. | |
| 2007/0160916 A1 | 7/2007 | Ikuta et al. | |
| 2011/0176121 A1* | 7/2011 | Loopstra | G03B 27/52 355/30 |
| 2012/0141922 A1* | 6/2012 | Deweerd | G03F 1/22 430/5 |
| 2012/0147349 A1 | 6/2012 | Dijsseldonk et al. | |
| 2013/0021717 A1 | 1/2013 | Singh | |
| 2014/0071581 A1* | 3/2014 | Haas | H01L 21/6831 361/234 |
| 2014/0186752 A1 | 7/2014 | Kinoshita et al. | |
| 2015/0077733 A1* | 3/2015 | Huang | G03F 7/70633 355/72 |

FOREIGN PATENT DOCUMENTS

| | | |
|---|---|---|
| CN | 1510515 A | 7/2004 |
| CN | 102472981 A | 5/2012 |
| JP | 2005064391 | 3/2005 |
| JP | 2005109358 A | 4/2005 |
| JP | 2010122304 | 6/2010 |
| JP | 2011228744 A | 11/2011 |
| WO | 2013062104 A1 | 5/2013 |
| WO | 2013141268 A1 | 6/2013 |

OTHER PUBLICATIONS

Reflective Mask Blank, Reflective Mask, Method for Manufacturing Reflective Mask Blank, and Method for Manufacturing Reflective Mask. 1006. Japan Patents Fulltext (03)), https://dialog.proquest.com/professional/docview/1392105423?accountid=161361 (accessed Apr. 1, 2019).*
PCT Preliminary Report on Patentability in PCT/US2014/071698 dated Jul. 7, 2016, 8 pages.
Analog Devices, "Decoupling Techniques", "Decoupling Techniques", Mar. 2009, pp. 14 (1-14), Analog, Inc., MT-101 Tutorial.

* cited by examiner

*Primary Examiner* — Kathleen Duda
(74) *Attorney, Agent, or Firm* — Servilla Whitney LLC

(57) ABSTRACT

An EUV lithography system and method of manufacturing thereof includes: an EUV light source; a chuck being thermally conducting and smooth having a surface with a predetermined chuck flatness; and a reflective lens system for directing EUV light from the EUV light source over the surface of the chuck.

14 Claims, 2 Drawing Sheets

EXTREME ULTRAVIOLET LITHOGRAPHY SYSTEM HAVING CHUCK ASSEMBLY AND METHOD OF MANUFACTURING THEREOF

CROSS-REFERENCE TO RELATED APPLICATION

This application claims the benefit of U.S. Provisional Patent Application Ser. No. 61/919,781 filed Dec. 22, 2013, and the subject matter thereof is incorporated herein by reference thereto.

TECHNICAL FIELD

The present invention relates generally to an extreme ultraviolet lithography system having chuck assembly and method of manufacturing thereof.

BACKGROUND

Extreme ultraviolet lithography (EUV lithography, also known as soft x-ray projection lithography) is a contender to replace deep ultraviolet lithography for the manufacture of 0.13 micron, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within an extremely narrow ultraviolet bandpass; e.g., 12 to 14 nanometer bandpass for 13 nanometer ultraviolet light.

This process requires costly glass with extremely low thermal expansion and mask blanks require months to fabricate. The glass needed for extreme ultraviolet lithography needs to be thin, extremely smooth, extremely sharp, and free of defects. Any imperfections to the lens element or masks can cause problems in the final product.

For example, because of the nature of the multilayer stack and small feature size, any imperfections in the layers will be magnified in the final product. Imperfections on the scale of a few nanometers can show up as printable defects on the finished mask and need to be eliminated from the surface of the mask blank before deposition of the multilayer stack. Thus, cost and time saving solutions need to be found while still maintaining the precisions and quality required for and extreme ultraviolet lithography.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

Embodiments of the present invention provide a method of manufacturing a semiconductor device includes: directing extreme ultraviolet (EUV) light from an EUV light source through a reflective lens system; interposing an EUV mask in the reflective lens system, the EUV mask having a substrate and a multi-layer stack forming a Bragg reflector, the multi-layer stack and the substrate having a thermally conducting smooth substrate with a predetermined substrate flatness held on a surface of a chuck being thermally conducting and smooth having a predetermined chuck flatness; and reflecting a pattern of the EUV mask on a semiconductor substrate for forming a semiconductor device.

Embodiments of the present invention provide an EUV lithography system includes: an EUV light source; a chuck being thermally conducting and smooth having a surface with a predetermined chuck flatness; and a reflective lens system for directing EUV light from the EUV light source over the surface of the chuck.

Embodiments of the present invention provide an EUV mask includes: a multi-layer stack in the form of a Bragg reflector; and a substrate under the multi-layer stack, the multi-layer stack and the substrate having a thermally conducting smooth surface and a predetermined substrate flatness held on a surface of a chuck being thermally conducting and smooth having a predetermined chuck flatness.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
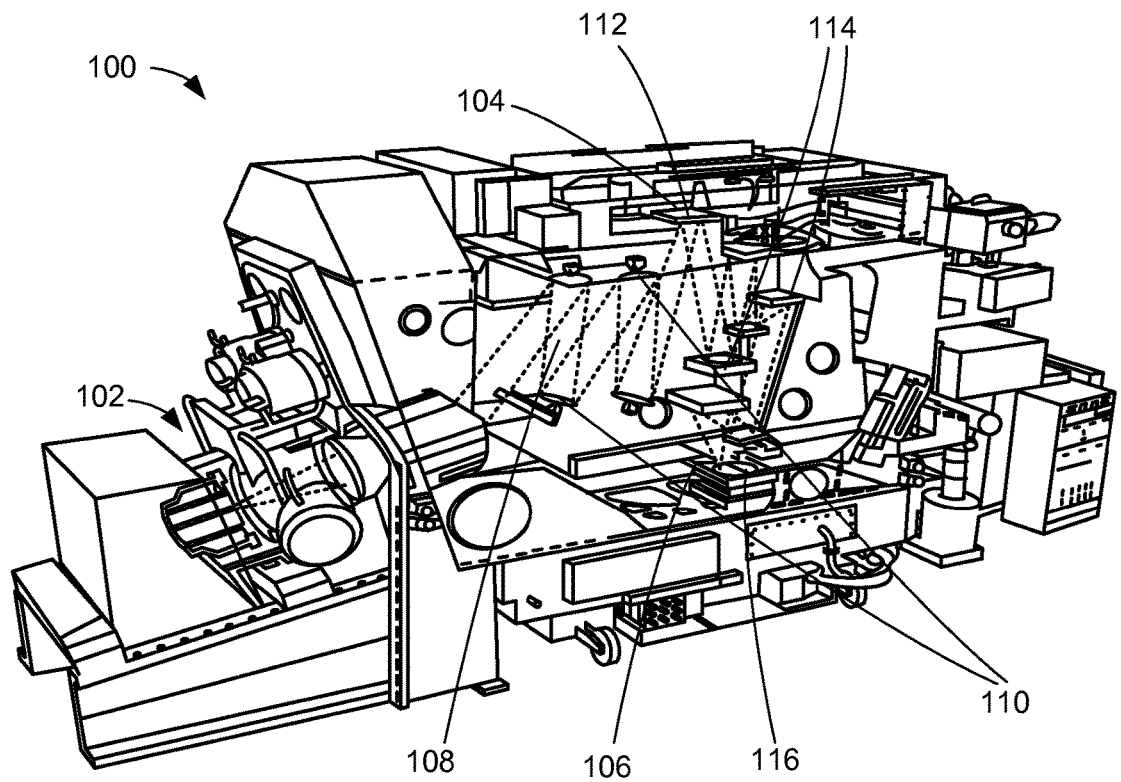
FIG. 1 is an exemplary EUV lithography system having a chuck assembly in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the embodiments of the present invention.

In the following description, numerous specific details are given to provide a thorough understanding of the invention. However, it will be apparent that the invention may be practiced without these specific details. In order to avoid obscuring the embodiments of the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the processed surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening elements.

The term "processing" as used herein includes deposition of material or photoresist, patterning, exposure, development, etching, cleaning, and/or removal of the material or photoresist as required in forming a described structure.

In a lithography system, such as an extreme ultraviolet (EUV) lithography system, EUV mask is a patterned reflective mask used for EUV lithography. The EUV mask is laminated with multiple layers before pattering, to be used for the production of a photomask in the semiconductor manufacturing. The EUV mask has a structure wherein a reflective layer to reflect EUV light and an absorber layer to absorb the EUV light, are formed in an order on a blank or a substrate made of rigid materials, such as ceramic or glass.

Typically, the reflective layer uses a multi-layer stack of reflective film having a low refractive index layer, such as a molybdenum (Mo) layer, and a high refractive index layer, such as a silicon (Si) layer, alternately stacked to have the light reflectivity improved when the layer surface is irradiated with the EUV light. For the absorber layer, materials having high absorption coefficients to the EUV light, such as the materials containing chromium (Cr) or tantalum (Ta) as the main components are used.

Usually, a protective layer is formed between the reflective layer and the absorber layer. Such a protective layer protects the reflective layer from being damaged by an etching process to be carried out forming a pattern in the absorber layer.

The EUV light uniformly illuminates onto the EUV mask. The EUV light projected on the reflective layer is reflected to a semiconductor substrate, such as a chip wafer, while the EUV light projected on the patterned absorber layer is absorbed and not reflected to the chip wafer. A pattern configured in the patterned absorber layer is printed on a surface layer of the chip wafer, for example a photoresist layer.

With respect to the absorber layer of the EUV mask, if the surface is poor in smoothness, edge roughness of the pattern formed on the absorber layer surface tends to be large, whereby the dimensional precision of the pattern tends to be low. The influence of the edge roughness tends to be distinct as the pattern becomes fine, and therefore, the absorber layer surface is required to be flat and smooth.

The EUV mask is made on a blank or a substrate of 6 millimeter (¼ inch) thick specialized rigid materials, such as a low thermal expansion (LTE) glass having zero thermal expansion (ZTE) over an assumed operating temperature. Thick glass is required to maintain rigidity and avoid distortion. However, the EUV mask, unlike transmissive masks for deep ultraviolet (DUV) mask, is reflective having a less than 70% reflectivity. The rest 30% of EUV power is absorbed by the EUV masks and converted primarily into heat. As the EUV light source power ramps up to meet production throughput requirement, the EUV power absorbed into the EUV mask can increase leading to potential degradation in the reflecting multi-layers, due to interdiffusion. This can result into a downhill spiral of more absorption and more interdiffusion. What more, glass is not a thermal conductor, especially when the glass is thick.

Embodiments of present invention use thermally conducting substrates, which can include specialized rigid materials and metallic atomically flat substrates to form the EUV mask. It is critical that the specialized rigid materials can be LTE glass as thin as 6 millimeter (mm) or ¼ of an inch or less, with a thermal conductivity in a range of 1.46 to 1.6 watts per meter per Kelvin ($W \cdot m^{-1} \cdot K^{-1}$), compared with typical glass substrate having a thickness of ½ to 1 inch. The metallic atomically flat substrates can include silicon (Si) wafers, or other metallic substrates, with a preferred thermal conductivity of 50 $W \cdot m^{-1} \cdot K^{-1}$ or higher. The silicon wafer can be of materials such as high density plasma (HDP) oxide, boron doped phosphorous glass, or amorphous silicon. The metallic substrates can be of such metals as molybdenum, titanium, ruthenium, and their oxides or alloys. The substrate's rigidity can be maintained by mounting it on a chuck, such as an electrostatic chuck (ESC) that can be machined to the flatness specified. It is critical that combined thickness of the ESC and the metallic substrate based EUV mask can be as thin as 1 mm or less.

The embodiments of the present invention use the thermally conducting substrates to form the EUV mask. The coefficient of the substrate is same or similar to the reflective layer or absorber layer formed thereon, to prevent detachment of the substrate and the layers deposited thereon. The similar or same coefficient of the substrate can also prevent deformation of the EUV mask, which is caused by different warping of different materials. Ideally, the coefficients of the substrate and multi-layers are as close as possible.

The substrate can be in a plurality of shapes including a square or circular form. If in a circular form, the substrate can be, for example a 300 mm diameter Si wafer, which allows using standard semiconductor processing equipment for mask fabrication. The greater dimension of the substrate can also allow for larger format masks, for example a 228 mm×228 mm (9"×9") square, to be implemented.

The ESC can be formed of rigid materials, including ceramic, to maintain the specified flatness of the chuck and the EUV mask. The ESC can have a cooling system of a gas or fluid coolant, to dissipate the heat absorbed from the EUV power. The ESC can have surface textures, for example mesas, to minimize particle contamination of a contacting surface with the substrate. The textures of the ESC surface can improve air circulation and further help heat dissipation in addition to the cooling system.

It has been discovered that, lithography system and method of manufacturing thereof disclosed in the embodiments of the present invention, can reduce the cost of the EUV masks and enables larger format masks, for example 154 mm×154 mm (6"×6") or greater, to be fabricated. The EUV mask having a thermally conducting substrate and the cooling system can dissipate heat caused by the EUV power, and maintain an idea operating temperature for a high dimensional precision of the pattern printed on a chip wafer. The substrate having similar or same coefficient as the multi-layers can prevent detachment or deformation of the EUV mask. The textures of the ESC surface can help heat dissipation and reduce particle contamination of the substrate.

Referring now to FIG. 1, therein is shown an exemplary EUV lithography system 100 having a chuck assembly in an embodiment of the present invention. The exemplary view includes a light source, such as an EUV light source 102, a reticle stage 104, a chip wafer stage 106, and an optical train.

The optical train is a reflective lens system 108 reflecting light from the EUV light source 102, such as a plasma source, to a destination, such as the chip wafer stage 106. The EUV light source 102 provides EUV light to facet mirrors 110 and a reticle, such as an EUV mask 112 held on the reticle stage 104. The facet mirrors 110 are optical elements used to generate a homogenization of the radiation generated by the EUV light source 102 on an illumination field illuminated in the EUV lithography system 100. The EUV mask 112 reflects the EUV light through projection optics 114 onto a chip wafer 116 held on the chip wafer stage 106. The EUV mask 112 is a special type of photo mask where the data for only part of the final exposed area is present.

The EUV mask 112 can have a substrate and a multi-layer stack forming a Bragg reflector. The multi-layer stack and the substrate can have a combined thickness of 1 mm or less. It is critical that the substrate being smooth have a predetermined substrate flatness or smoothness of 0.5 nanometer (nm) RMS (root-mean-square) or less when held on a surface of the chuck, which can be smooth having a predetermined chuck flatness or smoothness of 3 nm RMS or less. The substrates, such as silicon (Si) wafers or metallic substrates can be coated with the multi-layer stack. Thickness of the EUV mask 112 can be less than or equal to one mm, though a typical thickness of the EUV mask 112 can be about 700 um. The multi-layer stack can have a reflective layer and a patterned absorber layer deposited over the substrate. The pattern of the absorber layer is printed on the chip wafer 116 via the reflective lens system 108. A protection layer can be coated between the reflective layer and absorber layer for protection during fabrication processes.

The substrate, such as the silicon wafer or metallic substrate can be as thin as one mm or less and atomically flat, compared with the conventional glass substrate. The silicon wafers or metallic substrates are better thermal conductors than glass. The silicon wafers can be of materials such as high density plasma (HDP) oxide, boron doped phosphorous glass, or amorphous silicon. The metallic substrates can be of such metals as molybdenum, titanium, ruthenium, and their oxides or alloys. Other types of low thermal expansion and high thermal conductivity materials are also available for forming the substrates.

For example, a silicon wafer can have a lower linear thermal expansion coefficient of 2.56 per micron per Kelvin ($10^{-6} \cdot K^{-1}$) and a high thermal conductivity of 149 $W \cdot m^{-1} \cdot K^{-1}$, comparing with a glass substrate having a linear thermal expansion coefficient of 8.5 $10^{-6} \cdot K^{-1}$ and a thermal conductivity of 1.05 $W \cdot m^{-1} \cdot K^{-1}$ at an assumed operating temperature. The silicon wafer or metallic substrate with lower thermal expansion can reduce substrate deformation, while the higher thermal conductivity thereof can improve heat dissipation.

The EUV mask 112 can be configured to be a square, a circular, or other shapes based on the design and requirement of the EUV lithography system 100 and the chuck thereof. For example, if the EUV mask 112 is circular, it can be a 300 mm or larger diameter Si wafer, or 154 mm×154 mm (6"×6") or greater square. The above dimensions are critical to allow standard semiconductor processing equipment to be used for mask fabrication. It has been found that the silicon and metallic materials used to form the EUV mask 112 allows the EUV mask 112 to be made into non-industry standard sizes and shapes compared with the glass substrate.

The chuck, such as an ESC can be used to frame or mount the EUV mask 112 for use in the EUV lithography system 100. The ESC can be used to maintain the substrate rigidity for ultra-thin masks of one mm or less. The ESC can be machined to the various flatness specifications depending on the design and requirements of the EUV lithography system 100.

The ESC can include a mounting surface holding the EUV mask 112. The chuck surface can have a variety of textures and patterns to minimize contacting and particle contamination on the EUV mask 112. For examples, the textures of the mounting surface can include mesas, grooves, holes, or a combination thereof. Further, it has been found that the ESC can be modular and provide a system where multiple silicon and metallic based substrates can be easily interchangeable.

The EUV lithography system 100 can include a cooling system coupled to the ESC. The ESC can be cooled by the gas or fluid coolant, to dissipate the heat absorbed from the EUV light source 102 or EUV power. For example, the cooling system can use a helium cooling system or water-based cooling system.

It has been found that the use of the silicon wafers and metallic substrates can enable to fabricate a thinner than glass-based masks because silicon or metallic based masks do not curl like ultra-thin glass, to preserve the flatness of the mask and prevent defect caused by mask distortion thereof.

Further, it has been found that the use of the silicon wafer or metallic substrates for the EUV mask 112 allows for larger format masks to be used. The silicon wafer or metallic substrates do not suffer from the same manufacturing limitations as glass-based substrates, and can be more easily formed into different formats, sizes, and shapes. For example, sizes of the EUV mask 112 can be increased to greater than 154 mm×154 mm (6"×6") square, such as a 228 mm×228 mm (9"×9") square or even a 308 mm×308 mm (12"×12") square. Because silicon and metallic materials are used, the large format masks can be produced affordably compared to zero-thermal expansion glass-based masks.

Further, it has been found that a larger numerical aperture (NA) can be used during the lithography process on larger masks and thus increasing yield during projection. For example, a 228 mm×228 mm (9"×9") square or even a larger 308 mm×308 mm (12"×12") square can be now implemented, which can increase yield and reduce waste on photoresist wafers for final product devices.

Further, the ESC can be segmented with movable parts and platforms. These segments can be raised, titled, and adjusted to further ensure that each part of the substrate is resting on a flat surface. The segmented sections also allow for multiple masks to be used in creating different patterns for final product devices.

It has been discovered that the EUV mask 112 using a silicon wafer or metallic substrate, provides a reliable, versatile, and low cost alternative to glass-based EUV masks. For example, glass-based masks are made on 6 mm thick specialized glass with zero thermal expansion over the assumed operating temperature, while the EUV mask 112 of the embodiment of the present invention can be made on 1 mm thick thermal conductive substrate, with comparable low thermal expansion.

The embodiment of the present invention with the ESC and the silicon wafer or metallic substrate, can replace the thick glass with an alternative substrate of one mm or less. It has been found that combining the thin silicon wafer or metallic substrate with a flat ESC provides substrate rigidity for replacing the thick glass used in glass-based mask systems.

It has been found that the cooling system with the silicon or metallic substrates prevents thermal expansion by dissipating heat from the substrates and prevents pattern distortion. The silicon wafer or metallic substrate based masks with the cooling system are lower cost alternatives to glass-based masks because the silicon or metallic substrate can be produced cheaply and faster than glass-based masks. The cooling system can maintain an ideal operating temperature, for example 100 degrees Centigrade or lower, which is critical for preventing degradation of the EUV mask 112, and further reduce defects thereof.

Further it has been found that the use of the ESC and the silicon wafer or metallic substrate provides a mask with superior thermal conductive properties over glass-based masks. Glass is a bad thermal conductor and the thick width requirements of specialized glass further compound the bad thermal conductive properties.

Figure 2:
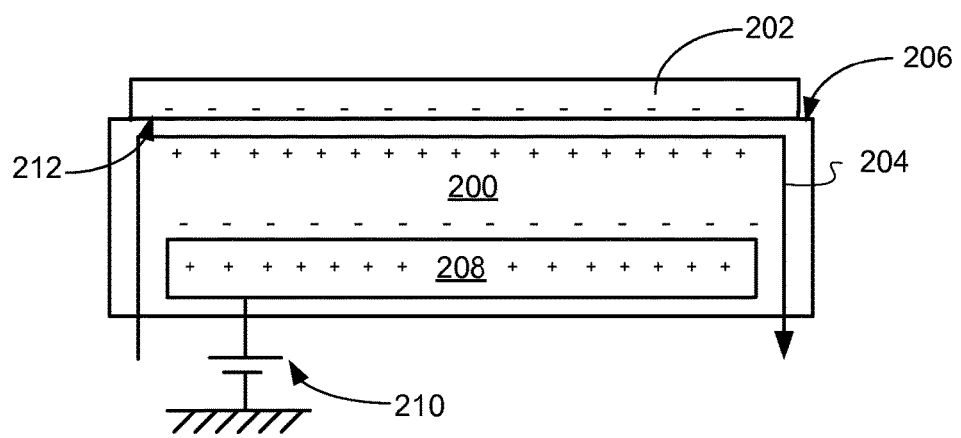
FIG. 2 is a cross-section of an exemplary ESC of the lithography system of FIG. 1 in accordance with an embodiment of the present invention.

Referring now to FIG. 2, therein is shown a cross-section of an exemplary ESC 200 of the EUV lithography system 100 of FIG. 1 in accordance with an embodiment of the present invention. The ESC 200 is shown in cross-section with a mask, such as an EUV mask 202 mounted thereon. The EUV mask 202 can be in a circular configuration, although it is understood that the EUV mask 202 can be fabricated in different shapes and sizes. For example, the EUV mask 202 can include a square, rectangular, or polygon configuration. The reticle stage 104 of FIG. 1 holds the ESC 200 and the EUV mask 202 mounted thereon.

The ESC 200 further includes a cooling system with a coolant 204 in forms of gas or liquid, which can include but not limited to helium or water respectively. The coolant 204 can circulate inside the ESC 200, close to a mounting surface 206 of the ESC where the EUV mask 202 mounted on. The coolant 204 enters the cooling system and flows to the mounting surface 206. The coolant 204 can cool down the EUV mask 202 by absorbing heat thereof. The coolant 204 heated by the EUV mask flows out of the cooling system, while the cold coolant 204 enters. The EUV mask 202 made of conductive materials can maintain a low operating temperature preventing potential degradation caused by the heat.

The ESC cooling system can also have plurality of tunnels close to the EUV mask 202. The tunnels can be parallel to the mounting surface 206, allowing the coolant 204 in the forms of gas or liquid enters tunnels from one vertical surface of the ESC 200, and exits from another vertical surface. The tunnels of the ESC 200 can be in variety configurations, depending upon the design of the ESC 200 or the EUV mask 202, to optimize the cooling efficiency.

An electrode 208 of conductor is embedded in the ESC 200. The electrode 208 is connected to an external power 210. The embodiment of the present invention shows a mono-polar type ESC, although it is understood that a bipolar type ESC can also be used. When the external power 210 is powered up, both positive and negative charges are redistributed at the mounting surface 206 and a back surface 212 of the EUV mask 202. When positive charges redistributed close to the mounting surface 206, negative charges redistributed to the back surface 212. The attraction between the positive charges and the negative charges can "grip" the EUV mask 202 on the ESC 200.

The silicon wafer and metallic substrate are better thermal conductors than glass. It has been found that, the silicon wafer or metallic substrate can improve the heat dissipation of the substrate, and further prevent potential degradation of the EUV mask 202 and particle contamination, resulting in a low defects mask, and high quality precise pattern printed on the chip wafer 116 of FIG. 1.

Figure 3:
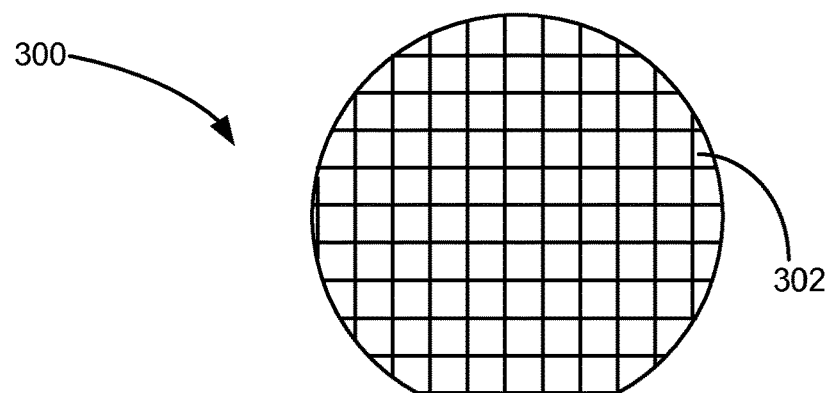
FIG. 3 is a top view of an exemplary ESC with an exemplary texture in accordance with an embodiment of the present invention.

Referring now to FIG. 3, therein is shown a top view of an exemplary ESC 300 with an exemplary texture 302 in accordance with an embodiment of the present invention. The texture 302 can include mesas, grooves, holes, or a combination thereof to minimize contacting of the EUV mask 202 of FIG. 2 and the ESC 300, to reduce particle contamination of the EUV mask 202 and improve heat dissipation.

When the EUV mask 202 is mounted on the ESC 300, the particle contamination may occur at a contact surface of the EUV mask 202 and ESC 300. The heat caused by the EUV light of FIG. 1 may amplify the particle contamination at the contact surface. The cooling system of FIG. 2 can lower the temperature of the substrate, while the texture 302 can also help heat dissipation by improving the air circulations on the contacting surface. The texture 302 can minimize the contacting surface of the ESC 300 and the EUV mask 202, and further reduce the particle contamination and the mask distortion caused by the heat.

It has been found that the ESC with textures can reduce particle contamination, and improve air circulation at the contacting surface for a better heat dissipation, resulting in reduction of the particle contamination and mask distortion.

Figure 4:
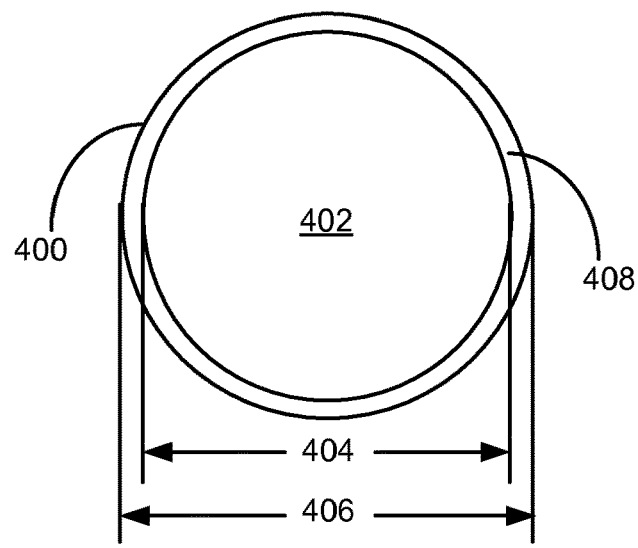
FIG. 4 is a top view of an exemplary ESC with a mask in place.

Referring now to FIG. 4, therein is shown a top view of an exemplary ESC 400 with a mask in place. The mask can be an EUV mask 402 having a substrate, such as a silicon wafer or metallic substrate. A mask dimension 404 of the EUV mask 402 is less than a chuck dimension 406 of the ESC 400, to ensure that the EUV mask 402 has sufficient support from the ESC 400. The EUV mask 402 can be attached to the ESC 400 electrostatically. The contacting surface of the EUV mask 402 and the ESC 400 can be textured.

Due to utilization of silicon or metallic materials, it is possible that the EUV mask 402 can be fabricated at a larger size, for example greater than 154 mm×154 mm (6"×6"), and the substrates are no longer limited to squares but can be various shapes.

It has been found that a slightly larger sized ESC 400 can maintain the rigidity and flatness of the EUV mask 402 mounted thereon during manufacturing processes. A margin 408 can minimize the misalignment or damage when mounting the EUV mask 402 on the ESC 400.

Figure 5:
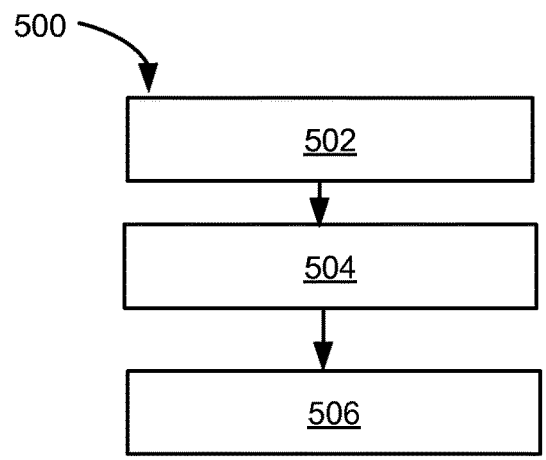
FIG. 5 is a flow chart of a method for manufacturing a semiconductor device in a further embodiment of the present invention

Referring now to FIG. 5, therein is shown a flow chart of a method 500 for manufacturing a semiconductor device in a further embodiment of the present invention. The method 500 includes: directing extreme ultraviolet (EUV) light from an EUV light source through a reflective lens system in a block of 502; interposing an EUV mask in the reflective lens system, the EUV mask having a substrate and a multi-layer stack forming a Bragg reflector, the multi-layer stack and the substrate having a thermally conducting smooth substrate with a predetermined substrate flatness held on a surface of a chuck being thermally conducting and smooth having a predetermined chuck flatness in a block of 504; and reflecting a pattern of the EUV mask on a semiconductor substrate for forming the semiconductor device in a block of 506.

The manufacturing process flow is exemplary and does not include other well-known components of lithography systems. It is understood that other well-known components of the lithography system are omitted for clarity in explanation.

It has been found that, an EUV mask having a silicon wafer or metallic substrate, or other low thermal expansion and high thermal conductivity substrates, can be fabricated thinner and larger, and can have better heat dissipation, resulting in reduction of mask defects. Textures of the ESC holding the EUV mask can reduce particle contamination of the substrate. The lithography system having the EUV mask and chuck assembly can print precise pattern or multiple patterns on the chip wafers, resulting in reduction of defects, decreasing manufacturing cost, and utilization of larger format mask.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the embodiments of the present invention is that it valuably supports and services the historical trend of reducing costs, simplifying systems, and increasing performance.

These and other valuable aspects of the embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a semiconductor device comprising:
   directing extreme ultraviolet (EUV) light from an EUV light source through a reflective lens system;
   interposing an EUV mask in the reflective lens system, the EUV mask having a substrate and a multi-layer stack forming a Bragg reflector, the multi-layer stack and the substrate having a thermally conducting smooth substrate with a predetermined substrate flatness held on a surface of a chuck being thermally conducting and smooth having a predetermined chuck flatness; and
   reflecting a pattern of the EUV mask on a semiconductor substrate for forming the semiconductor device, wherein interposing the EUV mask held on the surface of the chuck includes interposing the EUV mask held on the surface of the chuck having a textured mounting surface, wherein the textured mounting surface has mesas, grooves, holes, or a combination thereof.

2. The method as claimed in claim 1, wherein interposing the EUV mask having the substrate includes interposing the EUV mask having a specialized thin rigid material substrate, a silicon wafer, or a metallic substrate.

3. The method as claimed in claim 1, wherein interposing the EUV mask includes holding the EUV mask electrostatically on the surface of the chuck with a combined thickness of the chuck and the mask is 1 mm or less and the surface of the chuck has a predetermined chuck flatness of 3 nm RMS or less.

4. The method as claimed in claim 1, wherein interposing the EUV mask held on the surface of the chuck includes interposing the EUV mask held on the surface of the chuck having a cooling system using a gas or liquid coolant close to the EUV mask, at an operating temperature range of 100 degrees Centigrade of lower.

5. The method as claimed in claim 1, wherein the textured mounting surface reduces particle contamination.

6. The method as claimed in claim 1, wherein the textured mounting surface reduces distortion of the mask caused by the heat.

7. The method as claimed in claim 1, wherein the EUV mask has of 154 mm× 154 mm or greater.

8. The method as claimed in claim 1, wherein the predetermined substrate flatness is 0.5 nanometer root-mean-square or less when held on the surface of the chuck.

9. The method as claimed in claim 8, wherein the substrate is a metallic substrate.

10. The method as claimed in claim 1, wherein the substrate is a metallic substrate.

11. The method of claim 1, wherein the substrate has a thermal conductivity of 50 $W \cdot m^{-1} \cdot K^{-1}$.

12. The method of claim 1, wherein the textured mounting surface has mesas.

13. The method of claim 1, wherein the textured mounting surface has grooves.

14. The method of claim 1, wherein the textured mounting surface has holes.

\* \* \* \* \*

UNITED STATES PATENT AND TRADEMARK OFFICE
CERTIFICATE OF CORRECTION

PATENT NO. : 10,691,013 B2
APPLICATION NO. : 15/031677
DATED : June 23, 2020
INVENTOR(S) : Majeed A. Foad It is certified that error appears in the above-identified patent and that said Letters Patent is hereby corrected as shown below:

In the Claims

In Claim 1, Column 10, Line 1, insert --of 0.5 nanometer (nm) RMS (root-mean-square) or less-- after "flatness" and before "held on".

Signed and Sealed this
Twenty-fifth Day of August, 2020

Andrei Iancu
*Director of the United States Patent and Trademark Office*